(12) United States Patent
Ohbo et al.

(10) Patent No.: US 9,240,504 B2
(45) Date of Patent: Jan. 19, 2016

(54) SOLAR CELL AND METHOD OF MANUFACTURING THE SAME

(71) Applicant: SANYO ELECTRIC CO., LTD., Moriguchi, Osaka (JP)

(72) Inventors: Hiroki Ohbo, Moriguchi (JP); Takahiro Mishima, Moriguchi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 135 days.

(21) Appl. No.: 14/230,049

(22) Filed: Mar. 31, 2014

(65) Prior Publication Data

US 2014/0209165 A1 Jul. 31, 2014

Related U.S. Application Data

(63) Continuation of application No. PCT/JP2011/080259, filed on Dec. 27, 2011.

(51) Int. Cl.
| | |
|---|---|
| H01L 31/0236 | (2006.01) |
| H01L 31/0224 | (2006.01) |
| H01L 31/036 | (2006.01) |
| H01L 31/0368 | (2006.01) |
| H01L 31/068 | (2012.01) |
| H01L 31/0747 | (2012.01) |
| H01L 31/18 | (2006.01) |

(52) U.S. Cl.
CPC .... *H01L 31/02366* (2013.01); *H01L 31/03682* (2013.01); *H01L 31/0682* (2013.01); *H01L 31/0747* (2013.01); *H01L 31/18* (2013.01); *Y02E 10/546* (2013.01); *Y02E 10/547* (2013.01)

(58) Field of Classification Search
CPC ............... H01L 31/02366; H01L 31/0224; H01L 31/022425; H01L 31/022441; H01L 31/063
USPC .......................................... 136/252, 256, 258
See application file for complete search history.

(56) References Cited

U.S. PATENT DOCUMENTS

| | | | | | |
|---|---|---|---|---|---|
| 2004/0112421 | A1* | 6/2004 | Spivack | ............... | H01G 9/2027 136/256 |
| 2010/0263722 | A1 | 10/2010 | Kubo et al. | | |
| 2012/0015470 | A1* | 1/2012 | Nishimura | ............ | H01L 31/068 438/71 |

FOREIGN PATENT DOCUMENTS

| | | |
|---|---|---|
| JP | 2010-080887 A | 4/2010 |
| JP | 2010-258043 A | 11/2010 |
| WO | 2010/109692 A1 | 9/2010 |

* cited by examiner

*Primary Examiner* — Susan D Leong
(74) *Attorney, Agent, or Firm* — Marvin A. Motsenbocker; Mots Law, PLLC

(57) ABSTRACT

Provided is a solar cell with improved photoelectric conversion efficiency. The solar cell includes a photoelectric conversion body and first and second electrodes. The photoelectric conversion body includes a substrate made of semiconductor material. The first and second electrodes are disposed at intervals on one main surface of the photoelectric conversion body. Terraces each formed of a crystal plane are provided on a main surface of the substrate on the one main surface side of the photoelectric conversion body. At least one of the terraces exists between the first electrode and the second electrode.

10 Claims, 3 Drawing Sheets

SOLAR CELL AND METHOD OF MANUFACTURING THE SAME

CROSS REFERENCE TO RELATED APPLICATIONS

This application is a continuation application of International Application No. PCT/JP2011/080259, filed on Dec. 27, 2011, entitled "SOLAR CELL AND METHOD OF MANUFACTURING THE SAME", the entire contents of which are incorporated herein by reference.

BACKGROUND

The invention relates to a solar cell and a method of manufacturing the same.

Patent Document 1 proposes a back junction solar cell. In the back junction solar cell, it is not always necessary to provide electrodes on a light receiving surface. Due to this configuration, a light receiving efficiency on the light receiving surface can be improved. Accordingly, photoelectric conversion efficiency can be improved.

Patent Document 1: Japanese Patent Application Publication No. 2010-80887

SUMMARY OF THE INVENTION

There is a demand for a further improvement of photoelectric conversion efficiency of a solar cell.

One aspect of the invention provides a solar cell with improved photoelectric conversion efficiency.

A solar cell of the embodiment includes a photoelectric conversion body and first and second electrodes. The photoelectric conversion body includes a substrate made of semiconductor material. The first and second electrodes are disposed at an interval on one main surface of the photoelectric conversion body. A main surface of the substrate on the one main surface side of the photoelectric conversion body is provided with terraces each formed of a crystal plane. At least one of the terraces exists between the first electrode and the second electrode.

A method of manufacturing a solar cell of the embodiment relates to a method of manufacturing a solar cell including: a photoelectric conversion body including a substrate made of semiconductor material; and first and second electrodes disposed at an interval on one main surface of the photoelectric conversion body. In the method of manufacturing the solar cell, terraces formed of a crystal plane are formed on a main surface of the substrate on the one main surface side of the photoelectric conversion body by isotropically etching and then anisotropically etching the main surface of the substrate. The first and second electrodes are formed on the one main surface of the photoelectric conversion body at such an interval that at least one of the terraces exists between the first and second electrodes.

The embodiments above can provide a solar cell with improved photoelectric conversion efficiency.

BRIEF DESCRIPTION OF THE DRAWING

In FIG. 5, regions in which finger portions are provided are hatched and no cross sections of the hatched regions are illustrated.

EMBODIMENTS

Figure 1:
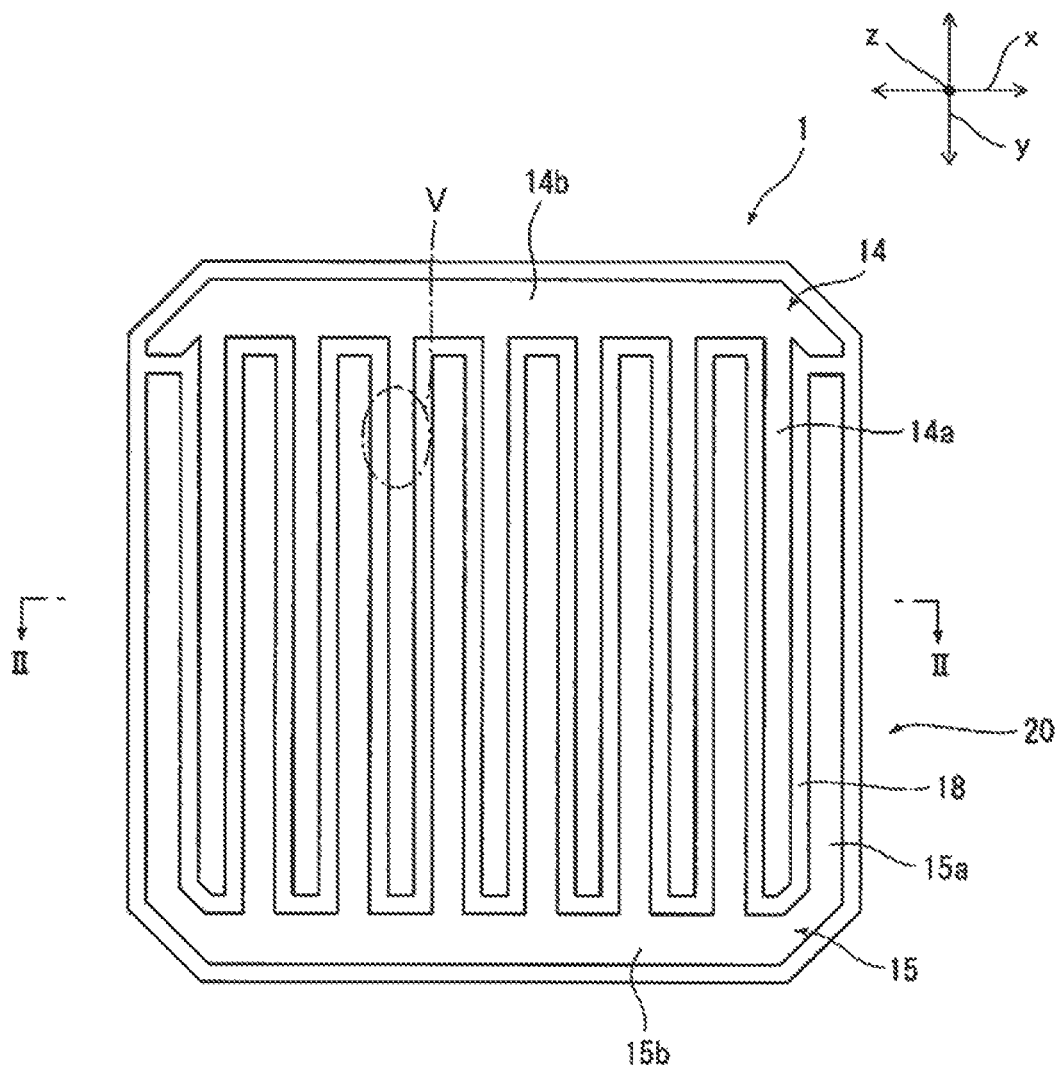
FIG. 1 is a schematic back view of a solar cell in one embodiment of the invention.

Embodiments of the invention are described below. However, the embodiments described below are merely an example. The invention is not limited by the embodiment described below at all.

Members having substantially the same function are referred to by the same reference numeral in the drawings referred in the embodiment and the like. Furthermore, the drawings referred in the embodiment and the like are schematically illustrated. Proportions of dimensions of objects illustrated in the drawings may be different from proportions of dimensions of actual objects. The dimensional proportions and the like of objects may be different among the drawings. Specific dimensional proportions and the like of objects should be determined in consideration of the following description.

Figure 2:
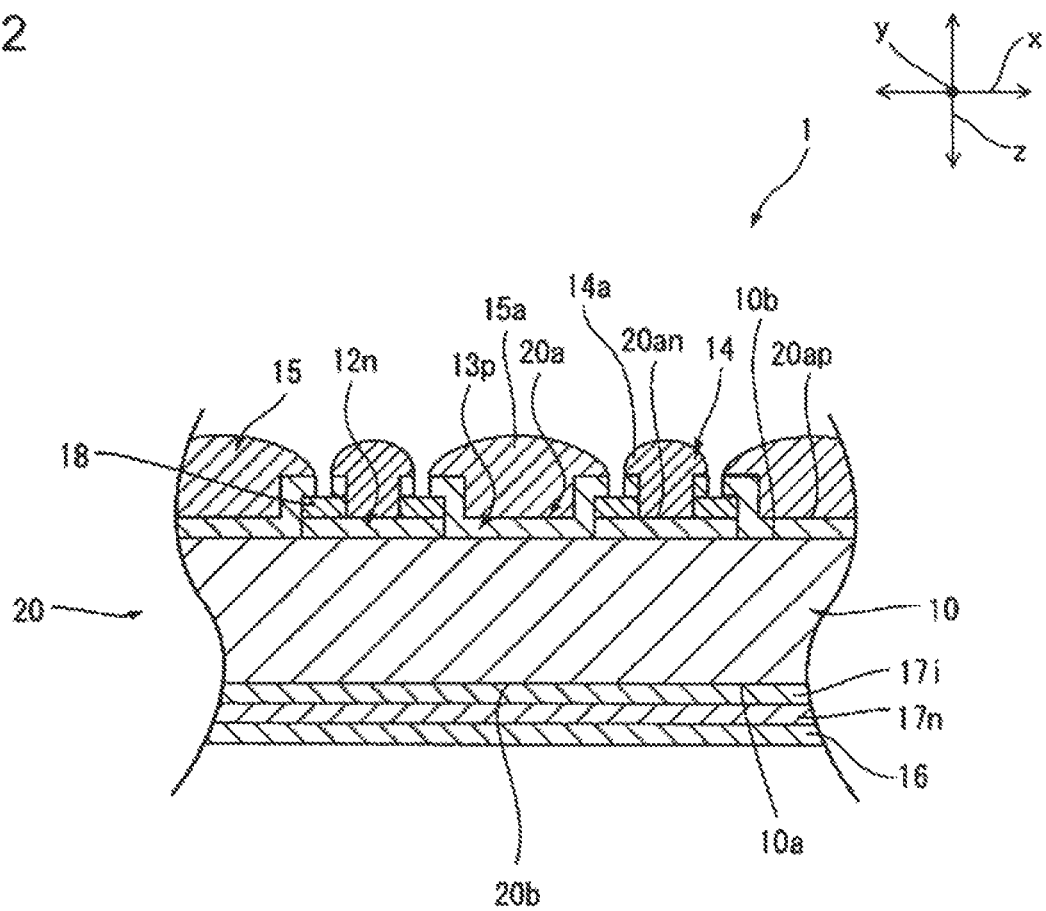
FIG. 2 is a schematic cross-sectional view along the line II-II of FIG. 1.

As illustrated in FIGS. 1 and 2, solar cell 1 includes photoelectric conversion body 20. Photoelectric conversion body 20 includes back surface 20a and light receiving surface 20b, which mainly receives light. Photoelectric conversion body 20 generates carriers such as electrons and electron holes upon receiving light.

Photoelectric conversion body 20 includes substrate 10 made of semiconductor material. Substrate 10 has one conductivity type. Specifically, in the embodiment, substrate 10 is made of an n-type crystalline semiconductor. Examples of preferably-used n-type crystalline semiconductors include n-type single-crystalline silicon and the like.

Substrate 10 includes first and second main surfaces 10b, 10a. Second main surface 10a forms light receiving surface 20b of photoelectric conversion body 20. Light receiving surface 20b formed of second main surface 10a has a textured structure.

Here, the "textured structure" refers to an uneven structure formed to suppress surface reflection and to increase a light absorption amount of the photoelectric conversion body. Specific examples of the textured structure include: a pyramid-shaped (square-pyramid shaped or square-frustum shaped) uneven structure obtained by anisotropically etching a surface of a single-crystalline silicon substrate having a (100) plane; an uneven structure obtained by isotropically etching a surface of a single-crystalline silicon substrate or a polycrystalline silicon substrate by a method such as acid etching or dry etching; and the like.

Substantially intrinsic i-type amorphous semiconductor layer 17$i$ and n-type semiconductor layer 17$n$ are disposed on second main surface 10a in this order.

Semiconductor layer 17$i$ can be made of, for example, i-type amorphous silicon containing hydrogen and the like. The thickness of semiconductor layer 17$i$ is not limited to a particular thickness as long as semiconductor layer 17$i$ does not substantially contribute to electric power generation. The thickness of semiconductor layer 17$i$ can be set to, for example, about few Å to about 250 Å.

n-type semiconductor layer 17$n$ is disposed on semiconductor layer 17$i$. Semiconductor layer 17$n$ is a semiconductor layer having the same conductivity type as substrate 10. Semiconductor layer 17$n$ can be made of, for example, an n-type amorphous semiconductor such as n-type amorphous silicon. The thickness of semiconductor layer 17n is not limited to a particular thickness. The thickness of semiconductor layer 17n can be set to, for example, about 50 Å to about 500 Å.

Protection film 16 is disposed on semiconductor layer 17n. Protection film 16 also has a function of a reflection suppressing film. Protection film 16 can be formed of, for example, a silicon oxide film, a silicon nitride film, a silicon oxynitride film, or the like. Out of these films, protection film 16 is preferably formed of the silicon nitride film. The thickness of protection film 16 can be set to, for example, about 80 nm to about 1 μm.

n-type semiconductor layer 12n is disposed on a first region of first main surface 10b of substrate 10. Semiconductor layer 12n forms n-type surface 20an forming part of back surface 20a.

Semiconductor layer 12n can be made of, for example, an n-type amorphous semiconductor such as n-type amorphous silicon. The thickness of semiconductor layer 12n can be set to, for example, about 20 Å to about 500 Å.

p-type semiconductor layer 13p is disposed on a second region of first main surface 10b of substrate 10 which is different from the first region. Semiconductor layer 13p forms p-type surface 20ap forming part of back surface 20a.

Semiconductor layer 13p can be made of a layer of a p-type amorphous semiconductor such as p-type amorphous silicon. The thickness of semiconductor layer 13p can be set to, for example, about 20 Å to about 500 Å.

Note that a substantially intrinsic i-type semiconductor layer having a thickness of, for example, about few Å to about 250 Å, which is such a thickness that the semiconductor layer does not substantially contribute to electric power generation can be disposed between n-type semiconductor layer 12n and first main surface 10b. Similarly, a substantially intrinsic i-type semiconductor layer having a thickness of, for example, about few Å to about 250 Å, which is such a thickness that the semiconductor layer does not substantially contribute to electric power generation can be disposed between p-type semiconductor layer 13p and first main surface 10b. The i-type semiconductor layers can be made of, for example, substantially intrinsic i-type amorphous silicon.

Insulating layer 18 is provided on part of semiconductor layer 12n. Specifically, insulating layer 18 is provided on both end portions of n-type semiconductor layer 12n in an x-direction, except for a center portion of n-type semiconductor layer 12n. The center portion of n-type semiconductor layer 12n in the x-direction is exposed from insulating layer 18. The material of insulating layer 18 is not limited to a particular material. Insulating layer 18 can be formed of, for example, a silicon oxide film, a silicon nitride film, or a silicon oxynitride film. Among these films, the silicon nitride film is preferably used to form insulating layer 18.

n-side electrode 14 and p-side electrode 15 are disposed at an interval on back surface 20a of photoelectric conversion body 20. n-side electrode 14 is disposed on n-type surface 20an. n-side electrode 14 is an electrode configured to collect electrons which are majority carriers.

n-side electrode 14 includes finger portions 14a. Finger portions 14a are arranged along an x-axis direction. Finger portions 14a are provided to have a linear shape extending in a y-axis direction orthogonal to the x-axis direction. However, finger portions 14a are not required to have the linear shape and may have, for example, a bent shape.

Finger portions 14a are electrically connected to bus bar portion 14b forming a current collector. Bus bar portion 14b is provided to have a linear shape extending in the x-axis direction. However there is no need to provide bus bar portion 14b in the embodiment. In the embodiment, for example, the electrode may be formed only of the finger portions or formed of the finger portions and a dot-shaped current collector to which the finger portions are electrically connected.

p-side electrode 15 is disposed on p-type surface 20ap. p-side electrode 15 is an electrode configured to collect electron holes which are minority carriers.

p-side electrode 15 includes finger portions 15a. Finger portions 15a are arranged along the x-axis direction. Finger portions 15a are disposed adjacent to finger portions 14a in the x-axis direction which coincides with a width direction of finger portions 14a, 15a. Finger portions 14a and finger portions 15a are alternately disposed at intervals in the x-axis direction.

Finger portions 15a are electrically connected to bus bar portion 15b forming a current collector. Bus bar portion 15b is provided to have a linear shape extending in the x-axis direction.

The width of each of finger portions 14a, 15a is preferably about 0.01 mm to about 10 mm, more preferably 0.05 mm to 5 mm. The width of finger portions 14a and the width of finger portions 15a may be different from each other or may be the same. However, it is preferable that the width of finger portions 15a configured to collect the minority carriers is larger than the width of finger portions 14a configured to collect the majority carriers.

The dimension of a gap between each adjacent two of finger portions 14a and finger portions 15a in the x-axis direction coinciding with the width direction of finger portions 14a, 15a is preferably about 0.001 mm to 1 mm, more preferably 0.005 mm to 0.5 mm. The gap between finger portion 14a and finger portion 15a is preferably smaller than each of the widths of finger portions 14a, 15a. Since this configuration can improve collection efficiency of carriers, more improved photoelectric conversion efficiency can be obtained. The dimension of the gap between finger portion 14a and finger portion 15a is preferably equal to or smaller than each of the widths of finger portions 14a, 15a, more preferably equal to or smaller than 0.5 times each of the widths of finger portions 14a, 15a.

Figure 3:
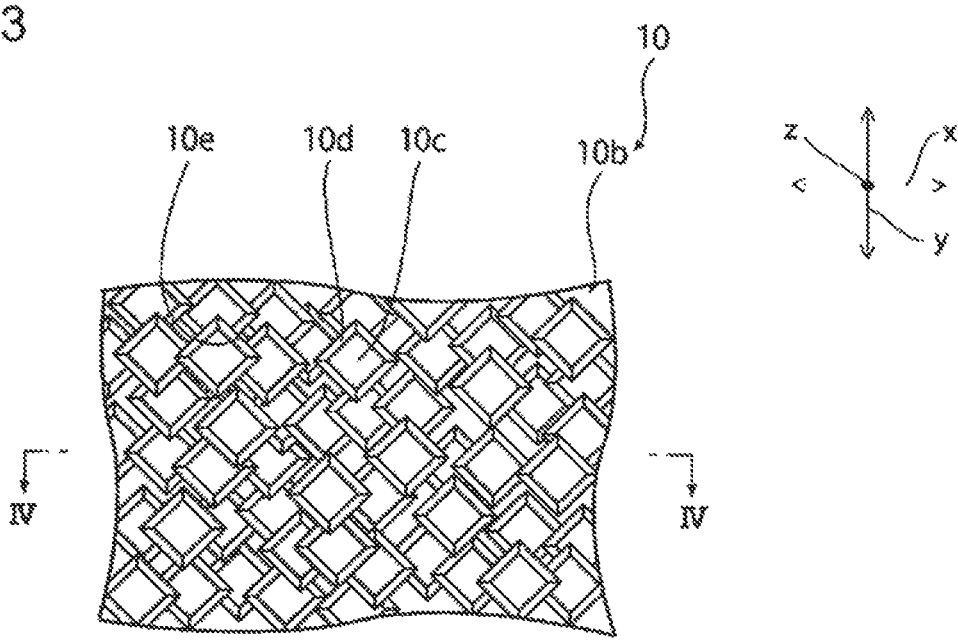
FIG. 3 is a schematic plan view illustrating one portion of a main surface of a substrate made of semiconductor material in an enlarge manner.
Figure 4:
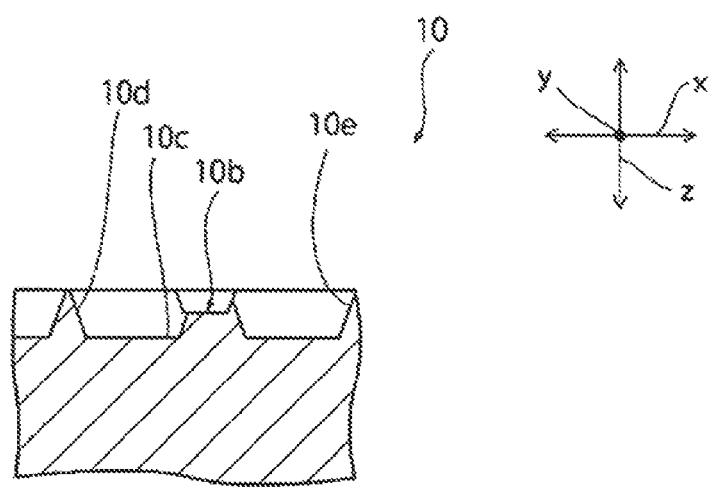
FIG. 4 is a schematic cross-sectional view along the line IV-IV of FIG. 3.

As illustrated in FIGS. 3 and 4, substrate 10 includes terraces 10c formed of crystal planes on at least main surface 10b. Specifically, in addition to terraces 10c, steps 10d are provided on main surface 10b. Terraces 10c are surrounded by steps 10d. Each of terraces 10c and step 10d surrounding this terrace 10c form uneven portion 10e including at least one of a recessed portion and a protruding portion. Uneven portions 10e formed by terraces 10c and steps 10d may be recessed portions or protruding portions. Moreover, both of recessed portions and protruding portions may be provided as uneven portions 10e. Steps 10d are also preferably formed of crystal planes.

Uneven portions 10e can be formed by anisotropically etching a crystalline silicon substrate by using alkaline etchants and the like. For example, when substrate 10 is formed of a crystalline silicon (100) substrate, terraces 10c are formed of (100) planes and steps 10d are formed of (111) planes. For example, when substrate 10 is formed of a crystalline silicon (111) substrate, terraces 10c are formed of (111) planes and steps 10d are formed of (1-11), (11-1), and (111-) planes. Accordingly, in the (100) substrate, terraces 10c have rectangular shapes. An angle formed between each of terraces 10c and a corresponding one of steps 10d is typically 125°. Moreover, in the (111) substrate, terraces 10c have triangular shapes. An angle formed between each of terraces 10c and a corresponding one of steps 10d is typically 120°. In summary, each of uneven portions 10e is typically a frustumshaped recess portion or protruding portion whose bottom surface has a quadrangular shape or a triangular shape. Note that, as illustrated in FIG. 3, uneven portions 10$e$ may be formed to overlap one another. The shapes of uneven portions 10$e$ are thus not necessarily limited to frustums whose bottom surfaces have rectangular shapes.

Note that, when terraces 10$c$ have square shapes, finger portions 14$a$, 15$a$ preferably extend substantially parallel to diagonal lines of terraces 10$c$.

Figure 5:
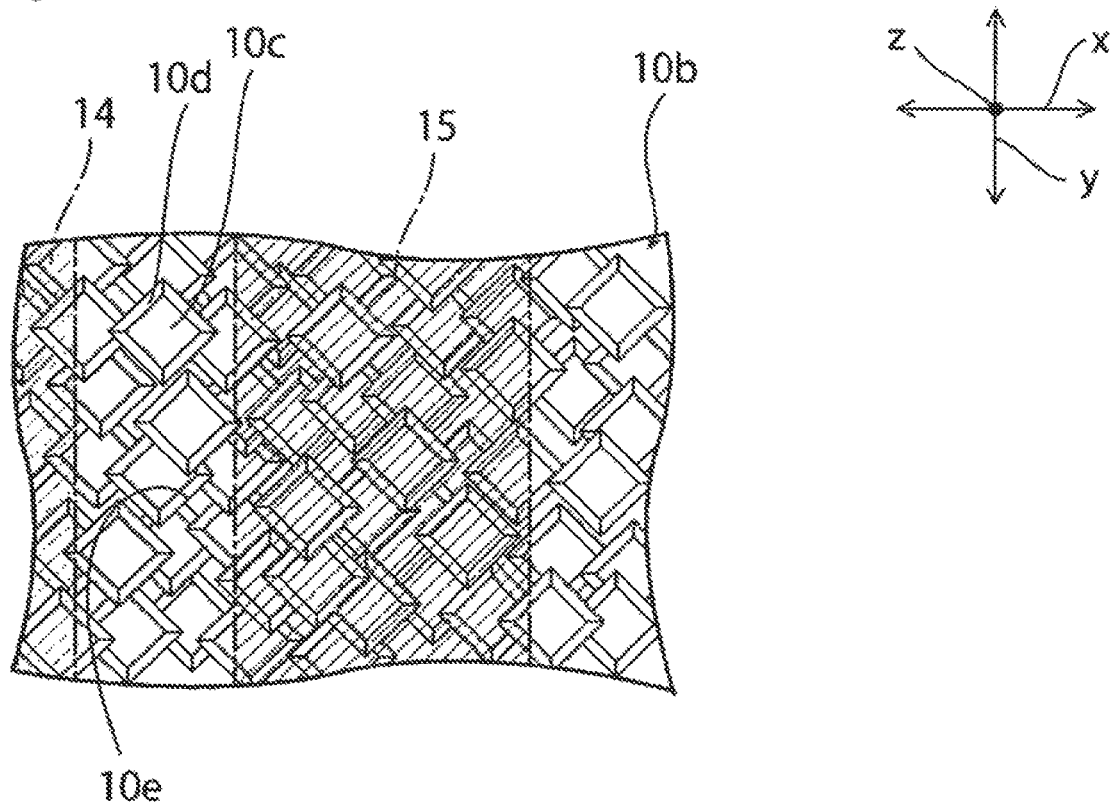
FIG. 5 is a schematic enlarged view of the V portion of FIG. 5.

As illustrated in FIG. 5, in solar cell 1, at least one of terraces 10$c$ exists between n-side electrode 14 and p-side electrode 15. To be specific, at least one of terraces 10$c$ exists between each adjacent two of finger portions 14$a$ and finger portions 15$a$. To be more specific, at least one of uneven portions 10$e$ exists between finger portion 14$a$ and finger portion 15$a$.

For example, when uneven portions 10$e$ are large and deep, form accuracy of semiconductor layers 12$n$, 13$p$ and electrodes 14, 15 which are provided on first main surface 10$b$ tends to deteriorate. Particularly, in a case where semiconductor layer 12$n$ and electrodes 14, 15 are formed with masks formed by using resists, appropriate application of the resists is hindered by uneven portions 10$e$ and formation of masks with high form accuracy is difficult. Hence, the form accuracy of semiconductor layers 12$n$, 13$p$ and electrodes 14, 15 tends to deteriorate. Accordingly, the photoelectric conversion efficiency tends to deteriorate. Moreover, in order to prevent contact and the like between electrodes 14, 15, n-side electrode 14 and p-side electrode 15 need to be designed to have a large interval therebetween in consideration of the form accuracy of electrodes 14, 15. An improvement of the photoelectric conversion efficiency is thus difficult to achieve also from the viewpoint of design.

Here, in solar cell 1, each of terraces 10$c$ is formed to have such a size that at least one of terraces 10$c$ exists between n-side electrode 14 and p-side electrode 15. This can suppress deterioration of the form accuracy of semiconductor layers 12$n$, 13$p$ and electrodes 14, 15 due to existence of terraces 10$c$. The interval between n-side electrode 14 and p-side electrode 15 can be thus designed to be smaller. Accordingly, the photoelectric conversion efficiency can be improved.

From a viewpoint of improving the photoelectric conversion efficiency, the dimension of terrace 10$c$ existing between finger portion 14$a$ and finger portion 15$a$ in the width direction of finger portions 14$a$, 15$a$ is preferably equal to or smaller than 0.8 times the dimension of the gap between finger portion 14$a$ and finger portion 15$a$ in the x-axis direction. In other words, it is preferable that terrace 10$c$ whose dimension in the x-axis direction is equal to or smaller than 0.8 times the dimension of the gap between finger portion 14$a$ and finger portion 15$a$ in the x-axis direction exists between finger portion 14$a$ and finger portion 15$a$.

An example of a method of manufacturing solar cell 1 is described below.

First, substrate 10 is produced. Substrate 10 can be produced by, for example, slicing an ingot made of semiconductor material with a wire saw.

Linear unevenness made by the wire saw which is called saw mark is formed on a surface of substrate 10 produced by slicing the ingot with the saw wire. Moreover, a damage layer having a thickness of, for example, about 10 μm is formed on a surface layer of substrate 10 due to contact with the wire saw and the like. Accordingly, it is preferable to perform a step of removing the damage layer and the saw mark. To perform this step, in the embodiment, the main surface of substrate 10 is first isotropically etched. An etchant used in the isotropic etching is not limited to a particular etchant. For example, isotropic etching gases such as nitric hydrofluoric acid, iodic acid, $CF_4+O_2$, and $NF_3+O_2$ and similar etchants are preferably used as the etchant. Among these, the nitric hydrofluoric acid is more preferably used. Furthermore, nitric hydrofluoric acid in which a volume ratio between hydrogen fluoride and nitric acid (hydrogen fluoride:nitric acid) is 1:100 to 1:1 is preferably used.

The thickness of the surface layer of substrate 10, which is removed in this isotropic etching, only needs to be such a thickness that the damage layer and the saw mark are appropriately removed. The thickness of the surface layer of substrate 10, which is removed in this isotropic etching, is preferably about 1 μm to about 20 μm, more preferably 3 μm to 15 μm.

Next, uneven portions 10$e$ including terraces 10$c$ and steps 10$d$ are formed on first main surface 10$b$ of substrate 10 by performing anisotropic etching. An etchant used in the anisotropic etching is not limited to a particular etchant. Alkaline etchants, anisotropic etching gases such as $NF_3+O_2+Cl_2$ and $ClF_3$, and similar etchants are preferably used as the etchant. Among these, alkaline etchants such as sodium hydroxide, potassium hydroxide, and TMAH (Tetramethylammonium hydroxide) are more preferably used.

For example, from a viewpoint of reducing etching steps, it is conceivable to perform the removal of the damage layer and the saw mark and the formation of uneven portions 10$e$ only by the anisotropic etching without performing isotropic etching. However, in this case, the thickness of the surface layer to be removed by the anisotropic etching is large. Accordingly, the anisotropic etching needs to be performed for a long period. Due to this, the sizes of terraces 10$c$ and steps 10$d$ become large and the sizes of uneven portions 10$e$ thus become large.

Meanwhile, in the embodiment, the damage layer and the saw mark are removed by the isotropic etching and then uneven portions 10$e$ including terraces 10$c$ and steps 10$d$ are formed by performing the anisotropic etching. Accordingly, there is no need to perform the anisotropic etching for a long period. Hence, it is possible to produce substrate 10 which includes no damage layer on the surface layer and which includes small uneven portions 10$e$. In other words, an increase in the sizes of uneven portions 10$e$ can be suppressed. Accordingly, it is possible to produce solar cell 1 in which at least one of terraces 10$c$ exists between n-side electrode 14 and p-side electrode 15.

From a viewpoint of reducing the sizes of uneven portions 10$e$, it is preferable that the etching amount in the isotropic etching is large. This can further reduce the sizes of uneven portions 10$e$. The etching amount in the anisotropic etching is preferably equal to or less than the etching amount in the isotropic etching, more preferably equal to or less than two times the etching amount in the isotropic etching.

Next, photoelectric conversion body 20 is produced by appropriately forming semiconductor layers 12$n$, 13$p$ and the like on first main surface 10$b$ of substrate 10. Semiconductor layers 12$n$, 13$p$ are preferably formed by forming semiconductor films by a CVD (Chemical Vapor deposition) method and patterning the semiconductor films by a photolithography method or the like. Forming semiconductor layers 12$n$, 13$p$ by the CVD method on terraces 10$c$ and steps 10$d$ formed of crystal planes can reduce an interface state density between first main surface 10$b$ and each of semiconductor layers 12$n$, 13$p$. Accordingly, the life time of carriers such as electrons and electron holes can be increased. Hence, the photoelectric conversion efficiency can be further improved.

Lastly, solar cell 1 can be completed by forming n-side electrode 14 and p-side electrode 15. Note that n-side electrode 14 and p-side electrode 15 can be each formed by a plating method, various printing methods such as a screen printing method, and the like.

In the embodiment, description is given of the example in which the finger portions are linearly provided. However, the finger portions may be provided in, for example, bent shapes.

The textured structure may be provided on both main surfaces of the substrate.

The photoelectric conversion body may be formed of substrate made of semiconductor material in which a p-type dopant diffusion region and an n-type dopant diffusion region are provided to be exposed on the back surface.

The invention claimed is:

1. A solar cell comprising:
    a photoelectric conversion body including a substrate made of semiconductor material; and
    first and second electrodes disposed at an interval on one main surface of the photoelectric conversion body, wherein
    a main surface of the substrate on the one main surface side of the photoelectric conversion body is provided with terraces each formed of a crystal plane, and
    at least one of the terraces exists between the first electrode and the second electrode.

2. The solar cell according to claim 1, wherein
    the terraces are formed by isotropically etching and then anisotropically etching the main surface of the substrate.

3. The solar cell according to claim 1, wherein
    the first electrode includes first finger portions,
    the second electrode includes second finger portions adjacent to the first finger portions, and
    at least one of the terraces exists between the first finger portion and the second finger portion.

4. The solar cell according to claim 3, wherein a gap between the first finger portion and the second finger portion is smaller than each of widths of the first finger portion and the second finger portion.

5. The solar cell according to claim 3, wherein
    uneven portions are provided on the main surface of the substrate by providing steps surrounding the terraces, the uneven portions including at least either of recessed portions and protruding portions which are formed of the terraces and the steps, and
    at least one of the uneven portions exists between the first finger portion and the second finger portion.

6. A method of manufacturing a solar cell including: a photoelectric conversion body including a substrate made of semiconductor material; and first and second electrodes disposed at an interval on one main surface of the photoelectric conversion body, the method comprising:
    forming terraces each formed of a crystal plane, on a main surface of the substrate on the one main surface side of the photoelectric conversion body by isotropically etching and then anisotropically etching the main surface of the substrate; and
    forming the first and second electrodes on the one main surface of the photoelectric conversion body at such an interval that at least one of the terraces exists between the first and second electrodes.

7. The method of manufacturing the solar cell according to claim 6, wherein an etching amount in the isotropic etching is larger than an etching amount in the anisotropic etching.

8. The method of manufacturing the solar cell according to claim 6, wherein
    the substrate is produced by slicing an ingot made of semiconductor material with a wire saw.

9. The method of manufacturing the solar cell according to claim 6, wherein
    the anisotropic etching is performed by using an alkaline etchant.

10. The method of manufacturing the solar cell according to claim 9, further comprising
    forming a semiconductor layer on the main surface of the substrate by a CVD method to thereby produce the photoelectric conversion body including the substrate and the semiconductor layer.

* * * * *